United States Patent [19]
Qian et al.

[11] Patent Number: 5,683,539
[45] Date of Patent: Nov. 4, 1997

[54] INDUCTIVELY COUPLED RF PLASMA REACTOR WITH FLOATING COIL ANTENNA FOR REDUCED CAPACITIVE COUPLING

[75] Inventors: Xue-Yu Qian, Milpitas; Arthur H. Sato, Santa Clara, both of Calif.

[73] Assignee: Applied Materials, Inc., Santa Clara, Calif.

[21] Appl. No.: 480,174

[22] Filed: Jun. 7, 1995

[51] Int. Cl.⁶ .................................................. C23F 1/02
[52] U.S. Cl. .................. 156/345; 216/68; 118/723 IR
[58] Field of Search ................ 118/723 E, 723 ER, 118/723 I, 723 IR, 723 MP; 150/345, 627.1, 626.1; 216/68; 204/298.34, 298.08

[56] References Cited

U.S. PATENT DOCUMENTS

| | | |
|---|---|---|
| 4,320,716 | 3/1982 | Boulanger et al. ................... 118/723 |
| 5,458,732 | 10/1995 | Butler et al. ........................... 216/61 |
| 5,525,159 | 6/1996 | Hama et al. ....................... 118/723 I |
| 5,540,800 | 7/1996 | Qian ...................................... 156/345 |

*Primary Examiner*—John Niebling
*Assistant Examiner*—Joni Y. Chang
*Attorney, Agent, or Firm*—Michaelson & Wallace

[57] ABSTRACT

In an inductively coupled RF plasma reactor having an inductive coil antenna connected through an RF impedance match network to an RF power source, capacitive coupling from the antenna to the plasma is reduced by isolating the coil antenna from the RF power source by an isolation transformer, so that the potential of the coil antenna is floating. The output of the RF impedance match network is connected across the primary winding of the isolation transformer while the floating coil antenna is connected across the secondary winding of the isolation transformer.

28 Claims, 2 Drawing Sheets

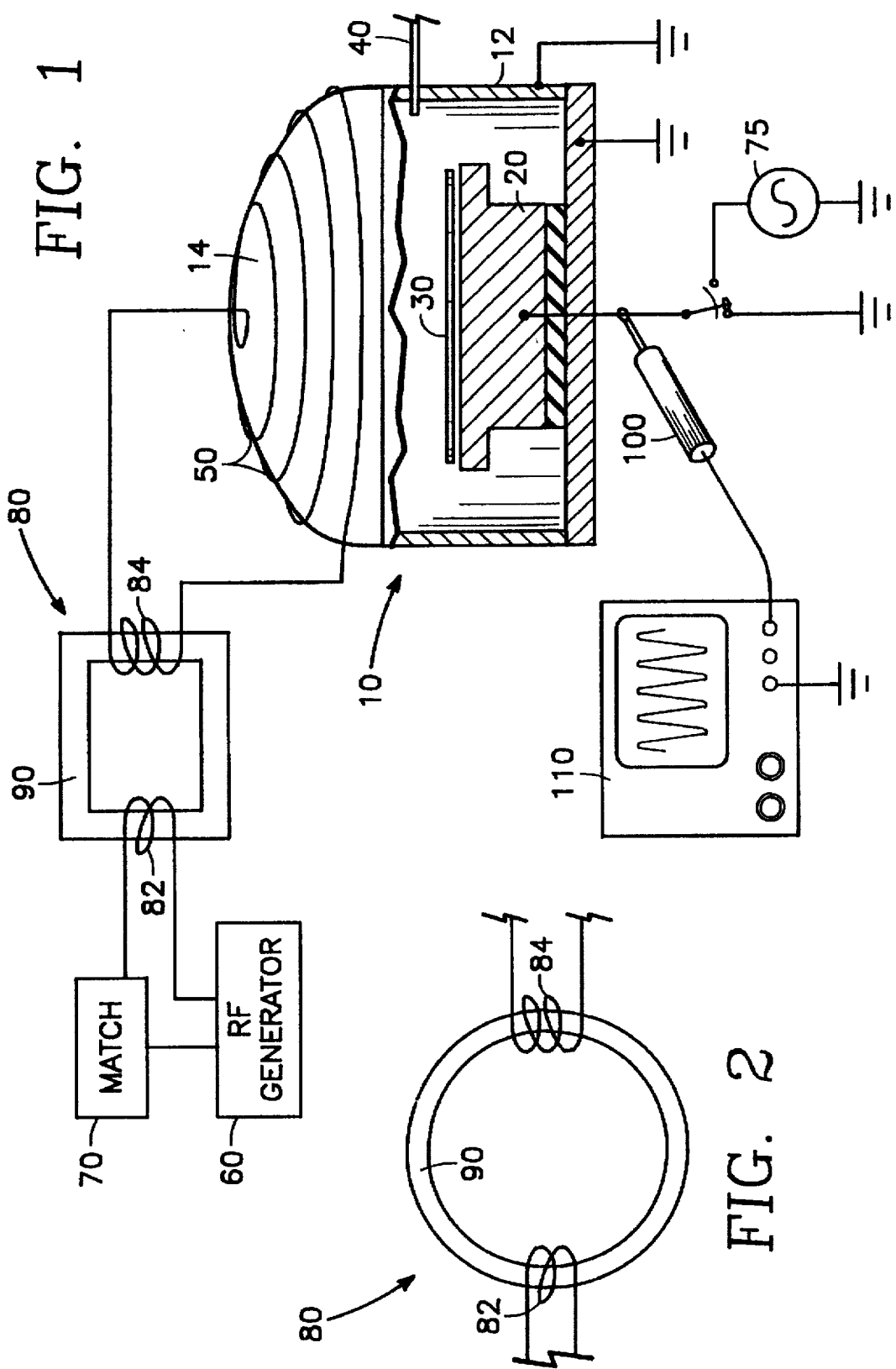

INDUCTIVELY COUPLED RF PLASMA REACTOR WITH FLOATING COIL ANTENNA FOR REDUCED CAPACITIVE COUPLING

BACKGROUND OF THE INVENTION

1. Technical Field

The invention is related to improvements in inductively coupled radio frequency (RF) plasma reactors for reducing capacitive coupling from the coil antenna to the semiconductor wafer.

2. Background Art

An inductively coupled RF plasma reactor typically includes a reactor chamber with a wafer pedestal for supporting a semiconductor wafer inside the chamber and a coil inductor or antenna over the chamber ceiling connected through an RF impedance match network to an RF power source. Gas introduced into the reactor chamber is ionized by the RF power coupled into the reactor chamber from the coil antenna to produce a plasma over the wafer. For various types of plasma processes carried out on the wafer, it is desirable that the plasma ion energy be distributed over a narrow range in order to optimize certain process parameters. For example, in an RF plasma etch process for etching a polysilicon layer formed over a thin oxide layer (e.g., a gate oxide layer) on the wafer, the etch process must have both high selectivity of polysilicon and high anisotropy. These goals can be met if the plasma ion energy is distributed over a narrow range.

The plasma ion energy is controlled by a bias RF power generator connected to the wafer pedestal. The bias RF power applied to the wafer pedestal is capacitively coupled to the plasma and can provide the desired narrow distribution of plasma ion energy, in the absence of other capacitive coupling. The problem is that stray capacitive coupling from the coil antenna to the plasma broadens the distribution of plasma ion energy and thus reduces the performance of the RF plasma process.

It is therefore a principal object of the invention to reduce any stray capacitive coupling from the coil antenna to the plasma.

SUMMARY OF THE INVENTION

In an inductively coupled RF plasma reactor having an inductive coil antenna connected through an RF impedance match network to an RF power source, capacitive coupling from the antenna to the plasma is reduced by isolating the coil antenna from the RF power source by an isolation transformer, so that the coil antenna has a floating potential. The output of the RF impedance match network is connected across the primary winding of the isolation transformer while the floating coil antenna is connected across the secondary winding of the isolation transformer. The reduction in capacitive coupling has been quantitatively measured to be more than a factor of two, a significant advantage.

BRIEF DESCRIPTION OF THE DRAWINGS

FIG. 1 is a schematic diagram illustrating a plasma reactor apparatus embodying the present invention.

FIG. 2 is a schematic diagram of a preferred embodiment of the isolation transformer employed in carrying out the invention.

DETAILED DESCRIPTION OF THE PREFERRED EMBODIMENTS

Figure 3:
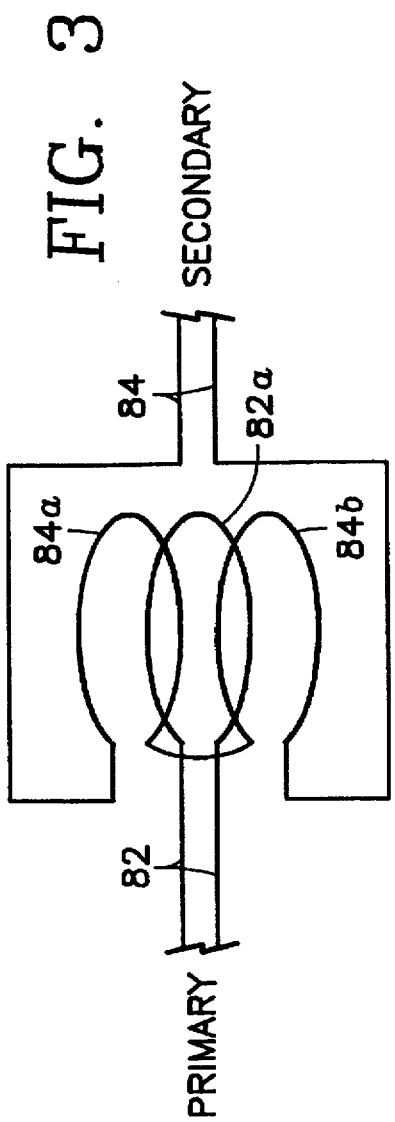
FIG. 3 is a schematic diagram of an alternative embodiment of the isolation transformer employed in carrying out the invention.

Referring to FIG. 1, an inductively coupled RF plasma reactor includes a grounded reactor chamber 10 having a grounded side wall 12 and ceiling 14 enclosing a wafer pedestal 20 for supporting a semiconductor wafer 30 to be processed. A gas inlet 40 introduces a processing gas into the chamber 10. The gas is ionized to produce a plasma over the wafer 30 by RF power inductively coupled to the plasma from an inductive coil antenna 50 wound over the ceiling of the chamber 10. The coil antenna 50 is coupled to an RF generator 60 through an RF impedance match network 70. Plasma ion energy at the wafer surface can be controlled by connecting a bias RF power generator 75 between the wafer pedestal 20 and ground.

In order to isolate the inductive coil antenna 50 from the RF power generator 60, an isolation transformer 80 is interposed between the match network 70 and the inductive coil antenna 50. Specifically, the isolation transformer 80 has a primary winding 82 and a secondary winding 84. The match network 70 and RF generator 60 are connected across the primary winding 82 in the manner shown in the drawing, while the inductive coil antenna 50 is connected across the secondary winding 84.

The isolation transformer 80 reduces or virtually eliminates any D.C. potential between the generator 60 and the inductive coil antenna 50, so that the electric potential of the coil antenna 50 is floating with respect to the wafer pedestal 20. The advantage is that capacitive coupling between the coil antenna 50 and the pedestal 20/wafer 30 is reduced as well. The result is that the coil antenna 50 has less effect upon plasma ion energy at the wafer surface, namely less broadening of the plasma ion energy distribution. A narrow plasma ion energy distribution is required in a plasma etch process, for example, to obtain high etch selectivity and high etch anisotropy.

The isolation transformer 80 may have an air gap between the primary and secondary windings 82, 84. Alternatively, the isolation transformer 80 may include a ferrite core 90 around which the primary and secondary windings 82, 84 are wound.

Referring to FIG. 2, the ferrite core 90 may be circular and have a diameter of between about three and five inches. The primary and secondary windings 82, 84 may each have between about 5 and 10 turns.

Referring to FIG. 3, if an air gap is employed in lieu of the ferrite core 90, the primary and secondary windings 82, 84 may be in close proximity to one another. Specifically, as illustrated in FIG. 3, the primary winding 82 may consist of a single turn 82a disposed between a pair of successive turns 84a, 84b of the secondary winding 84. In accordance with one embodiment, the primary and secondary windings 82, 84 of FIG. 3 may all have a uniform diameter of about two inches and the primary winding turn 82a is separated from the secondary winding turn 84a by 0.5 inch and from the other secondary winding 84b by 0.5 inch.

The reduction in capacitive coupling achieved by the present invention has been quantitatively measured. Specifically, it has been found that the RF current from the plasma to the wafer pedestal induced by capacitive coupling is reduced by more than a factor of two.

A method of quantitatively measuring the RF current induced by capacitive coupling alone (as distinguished from that induced by inductive coupling alone) is described in co-pending U.S. application Ser. No. 08/475,878, filed on date even herewith by the inventors herein and entitled "METHOD OF MEASURING THE AMOUNT OF CAPACITIVE COUPLING OF RF POWER IN AN INDUCTIVELY COUPLED PLASMA", the disclosure of which is incorporated herein by reference. Essentially, that method involves separating the measured RF current from the plasma to the wafer pedestal into different frequency components, including a component at the fundamental frequency (F) of the RF generator 60 and the second harmonic (2F) thereof. The method further involves measuring the amount of capacitive coupling by measuring the current of the fundamental component at frequency F.

In testing the present invention, the quantitative measurement method of the referenced co-pending application employed a current probe 100 monitoring the current from the wafer pedestal to ground (with the bias RF power generator 75 being bypassed) and an oscilloscope 110 connected to the output of the current probe 100. The measurement was carried out with the plasma source RF power generator 60 operating at a fundamental frequency of 13.56 MHz. The inductively coupled component of the current measured by the current probe 100 produced a 27.12 MHz sine wave trace on the oscilloscope 110 while the capacitively induced component of the current measured by the current probe 100 produced a 13.56 MHz sine wave trace on the oscilloscope 110. The amplitude of the latter component indicates the quantity of capacitive coupling and was observed over a large range of RF power of the generator 60.

Figure 4:
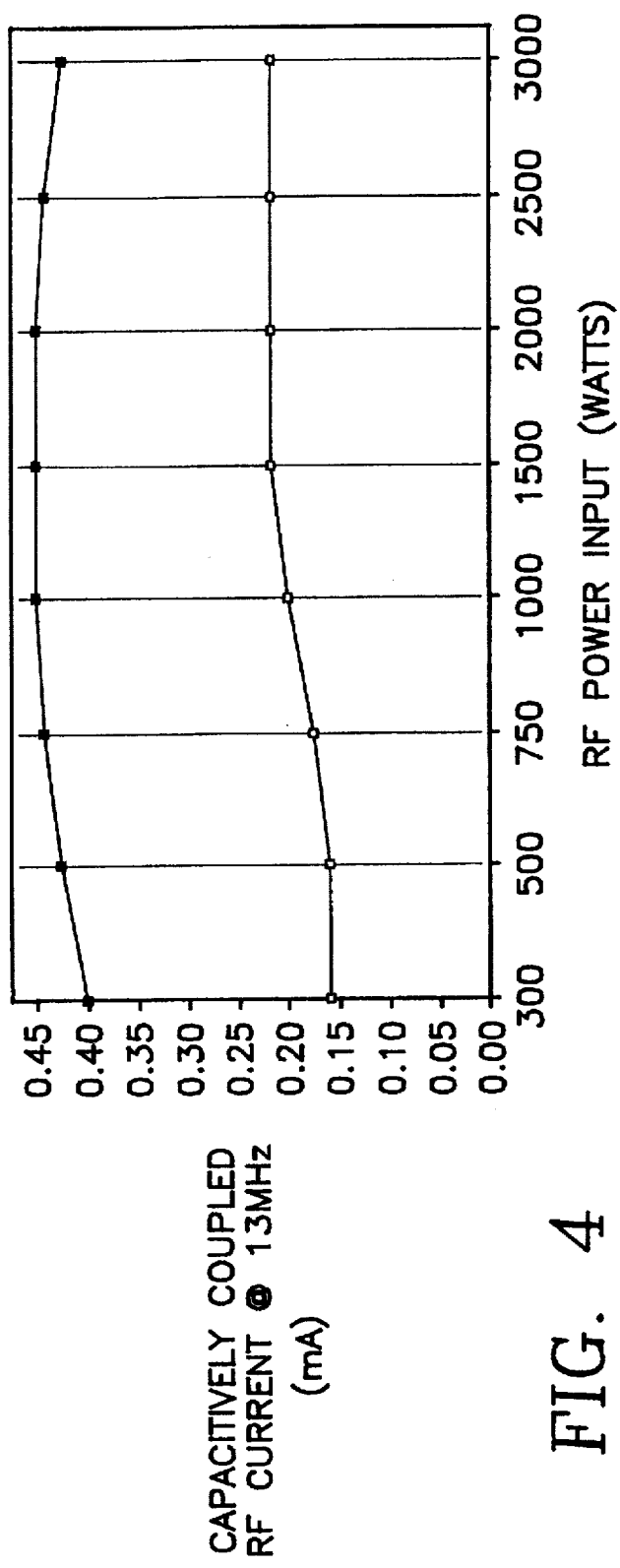
FIG. 4 is a graph illustrating capacitively coupled RF current to the wafer from the inductive coil antenna with and without the isolation transformer of the embodiment of FIG. 1.

The results are plotted in the graph of FIG. 4, in which the capacitively coupled component of the RF current through the probe 100 is plotted along the ordinate while the RF power is plotted along the abscissa. The curve with white squares illustrates the results obtained using the present invention. In a second test carried out in order to obtain comparative results, the isolation transformer 80 was bypassed and the RF power varied over the same range while the capacitively coupled component of the current through the probe 100 was monitored at the oscilloscope 110, and the results are plotted in FIG. 4 as the curve with black squares. Comparing the two curves, it is clear that the capacitively coupled component of the RF current to the wafer pedestal is reduced, at 300 Watts RF power for example, from 0.4 mA to 0.16 mA, which is an improvement by more than a factor of two.

While the invention has been described in detail by specific reference to preferred embodiments, it is understood that variations and modifications thereof may be made without departing from the true spirit and scope of the invention.

What is claimed is:

1. An inductively coupled plasma reactor for use with a plasma source power RF generator having an RF frequency F, said reactor comprising:
   a reactor chamber adapted to admit a processing gas into said chamber and a pedestal for supporting a semiconductor substrate inside said chamber;
   an inductively coupled antenna adjacent said chamber for producing a plasma from said gas by inductive coupling of RF power;
   a plasma source power RF generator coupled to said antenna having a fundamental RF frequency F; and
   an isolation transformer coupling said RF generator to said inductive antenna, said isolation transformer being coreless and having an air gap between said primary and secondary windings.

2. The reactor of claim 1 wherein said isolation transformer comprises a primary winding coupled to said RF generator and a secondary winding coupled to said inductive antenna.

3. The reactor of claim 1 further comprising an RF impedance match network connected between said generator and said isolation transformer.

4. The reactor of claim 3 wherein said isolation transformer comprises a primary winding connected to said RF impedance match network and a secondary winding connected to said inductive antenna.

5. The reactor of claim 4 wherein said inductive antenna comprises a coiled conductor having a pair of ends, said coiled conductor being wound over a portion of said chamber and wherein said secondary winding is connected across said pair of ends of said coiled conductor.

6. The reactor of claim 1 wherein said secondary winding comprises a pair of successive turns and said primary winding comprises a turn disposed between said pair of successive turns of said secondary winding.

7. The reactor of claim 1 further comprising instrumentation for quantitatively measuring a capacitively coupled component of current from said plasma to said pedestal.

8. The reactor of claim 7 wherein said instrumentation comprises:
   a conductor connected between said pedestal and ground;
   a current probe adjacent said conductor; and
   means for observing a component of current through said conductor at a frequency equal to said fundamental frequency.

9. The reactor of claim 1 further comprising a bias RF generator connected between said pedestal and ground.

10. An inductively coupled plasma reactor for use with a plasma source power RF generator having an RF frequency F, said reactor comprising:
    a reactor chamber with a gas inlet for introducing a processing gas into said chamber and a pedestal for supporting a semiconductor substrate inside said chamber;
    an inductively coupled antenna adjacent said chamber for producing a plasma from said gas by inductive coupling of RF power, said inductively coupled antenna comprising a coiled conductor wound over a portion of said chamber, said coil conductor being terminated at a pair of ends;
    a plasma source power RF generator coupled to said antenna having a fundamental RF frequency F;
    an RF impedance match network having an input connected to an output of said RF generator; and
    an isolation transformer coupling said RF generator to said inductive antenna and having a primary winding connected to an output of said RF impedance match network and a secondary winding, said pair of ends being connected across said secondary winding, and wherein said isolation transformer is coreless and has an air gap between said primary and secondary windings.

11. The reactor of claim 10 wherein said secondary winding comprises a pair of successive turns and said primary winding comprises a turn disposed between said pair of successive turns of said secondary winding.

12. The reactor of claim 10 further comprising a measurer for quantitatively measuring a capacitively coupled component of current from said plasma to said pedestal.

13. The reactor of claim 12 wherein said measurer comprises:

a conductor connected between said pedestal and ground;

a current probe adjacent said conductor; and means for observing a component of current through said conductor at a frequency equal to said fundamental frequency.

14. The reactor of claim 10 further comprising a bias RF generator connected between said pedestal and ground.

15. An inductively coupled plasma reactor for use with a plasma source power RF generator having an RF frequency F, said reactor comprising:

a reactor chamber adapted to admit a processing gas into said chamber and a pedestal for supporting a semiconductor substrate inside said chamber;

an inductively coupled antenna adjacent said chamber for producing a plasma from said gas by inductive coupling of RF power;

a plasma source power RF generator coupled to said antenna having a fundamental RF frequency F; and an isolation transformer coupling said RF generator to said inductive antenna, said isolation transformer having a primary winding and a secondary winding wherein said primary winding is wound around a first portion of a ferrite core and the secondary winding is wound around a separate second portion of the ferrite core.

16. The reactor of claim 15 wherein the primary winding is coupled to said RF generator and the secondary winding coupled to said inductive antenna.

17. The reactor of claim 15 further comprising an RF impedance match network connected between said generator and said isolation transformer.

18. The reactor of claim 17 wherein the primary winding is connected to said RF impedance match network and the secondary winding connected to said inductive antenna.

19. The reactor of claim 18 wherein said inductive antenna comprises a coiled conductor having a pair of ends, said coiled conductor being wound over a portion of said chamber and wherein said secondary winding is connected across said pair of ends of said coiled conductor.

20. The reactor of claim 15 wherein said ferrite core has a quadrangular shape.

21. The reactor of claim 15 wherein said ferrite core has a circular shape.

22. The reactor of claim 21 wherein said ferrite core has a diameter of between about three and five inches.

23. The reactor of claim 15 wherein the primary winding and secondary winding each have between about five to ten turns.

24. The reactor of claim 15 further comprising instrumentation for quantitatively measuring a capacitively coupled component of current from said plasma to said pedestal.

25. The reactor of claim 24 wherein said instrumentation comprises:

a conductor connected between said pedestal and ground;

a current probe adjacent said conductor; and means for observing a component of current through said conductor at a frequency equal to said fundamental frequency.

26. The reactor of claim 15 further comprising a bias RF generator connected between said pedestal and ground.

27. The reactor of claim 6 wherein each turn of the secondary winding and the turn of the primary winding are circular and have a diameter of about two inches.

28. The reactor of claim 6 wherein each turn of the secondary winding is separated from the turn of the primary winding by 0.5 inches.

* * * * *